(12) United States Patent
Duesterberg et al.

(10) Patent No.: US 8,970,417 B2
(45) Date of Patent: Mar. 3, 2015

(54) METHOD FOR GENERATING A DIGITAL SIGNAL

(75) Inventors: Dirk Duesterberg, Emmerthal (DE); Holger Borcherding, Hessisch Oldendorf (DE)

(73) Assignee: Lenze Automation GmbH, Aerzen (DE)

( * ) Notice: Subject to any disclaimer, the term of this patent is extended or adjusted under 35 U.S.C. 154(b) by 0 days.

(21) Appl. No.: 14/237,734

(22) PCT Filed: Aug. 7, 2012

(86) PCT No.: PCT/EP2012/065471
§ 371 (c)(1),
(2), (4) Date: Mar. 27, 2014

(87) PCT Pub. No.: WO2013/020987
PCT Pub. Date: Feb. 14, 2013

(65) Prior Publication Data
US 2014/0226709 A1   Aug. 14, 2014

(30) Foreign Application Priority Data

Aug. 8, 2011  (DE) .................... 10 2011 080 586

(51) Int. Cl.
*H03M 3/00*     (2006.01)
*H04L 25/49*    (2006.01)
*H04B 1/40*     (2006.01)
*H02M 5/45*     (2006.01)

(52) U.S. Cl.
CPC ........... *H04L 25/4902* (2013.01); *H03M 3/462* (2013.01); *H04B 1/40* (2013.01); *H02M 5/45* (2013.01)
USPC ............................. 341/143; 341/157; 375/238

(58) Field of Classification Search
CPC ...... H04L 25/4902; H04B 1/40; H03M 3/462; H03M 3/432; H03M 1/822; H02M 5/45
USPC ........... 341/155, 144, 143, 157; 375/238, 239
See application file for complete search history.

(56) References Cited

U.S. PATENT DOCUMENTS 4,972,436 A    11/1990  Halim et al.
5,901,176 A *  5/1999   Lewison ...................... 375/238
(Continued)

FOREIGN PATENT DOCUMENTS

DE   10 2007 032 484 A1   1/2009
EP      0 910 168 A1      4/1999

OTHER PUBLICATIONS

Corresponding International Search Report with English Translation dated Nov. 30, 2012 (four (4) pages).

*Primary Examiner* — Peguy Jean Pierre
(74) *Attorney, Agent, or Firm* — Crowell & Moring LLP

(57) ABSTRACT

A method is provided for generating a digital signal (DS) from an analog signal (IA, UA) generated by a frequency converter on the basis of pulse width modulation, wherein the digital signal corresponds to a mean value of the analog signal over a period of the pulse width modulation. The method includes the acts of: generating a bit stream (BS(i)) with a predetermined bit repetition duration (BW) depending on the analog signal by way of a sigma-delta modulator (1) and, during a time interval which has a duration which is at least as great as the period of the pulse width modulation: multiplying a respective bit (BS(i)) of the bit stream by a corresponding rating coefficient (BK(i)) for generating a respective bit/rating coefficient product and summing the respective bit/rating coefficient products, wherein the sum represents the digital signal.

15 Claims, 2 Drawing Sheets

(56) References Cited

U.S. PATENT DOCUMENTS

| | | |
|---|---|---|
| 5,940,019 A | 8/1999 | Maejima |
| 7,327,296 B1 * | 2/2008 | Gaboriau et al. ............ 341/143 |
| 7,965,214 B2 * | 6/2011 | Khoury et al. ................ 341/152 |
| 8,203,300 B2 * | 6/2012 | Krah ............................. 318/636 |
| 2007/0108953 A1 | 5/2007 | Latham |

* cited by examiner

METHOD FOR GENERATING A DIGITAL SIGNAL

BACKGROUND AND SUMMARY OF THE INVENTION

The invention relates to a method for generating a digital signal from an analog signal generated by means of a frequency converter, and to a frequency converter for implementing the method.

Frequency converters typically generate pulse-width-modulated signals, for example in the form of a (phase) voltage, for driving electric motors, wherein the phase voltage in turn provides a phase current. In the case of frequency converters which feed back the phase current in the context of closed-loop control, the quality of the signal measurement or signal feedback is of high importance.

For this purpose, the signals to be measured are generally picked up by use of suitable sensors, subjected to analog filtering, and then sampled and digitized by use of conventional analog-to-digital converters.

The generally saw-tooth-shaped phase current as one of the relevant signals is generally sampled synchronously in the middle of a respective period of the pulse width modulation. When sampling does not take place precisely in the middle, however, an offset measurement error can be caused.

By averaging over a period of the pulse width modulation, the above-mentioned disruptive effects can be reduced. For the averaging, a plurality of digital measured values is conventionally obtained over a period of the pulse width modulation and then a mean value is calculated over the measured values obtained.

A method in which such averaging is performed is described in DE 10 2007 032 484 A1.

The invention is based on the problem of providing a method for generating a digital signal from an analog signal generated by use of a frequency converter on the basis of pulse width modulation, and a frequency converter for implementing the method, which method and frequency converter are simple and inexpensive to implement and, in particular, enable interference-free and reliable digitization.

The invention solves this problem by providing a method for generating a digital signal from an analog signal, the analog signal generated by a frequency converter on the basis of pulse width modulation, wherein the digital signal corresponds to a mean value of the analog signal over a period of the pulse width modulation. The method comprising the following steps: generating a bit stream in response to the analog signal by a sigma-delta modulator, the bit stream having a predetermined bit repetition duration; and during a time interval having a duration equal to or larger than the period of the pulse width modulation: (i) multiplying a respective bit of the bit stream by a corresponding rating coefficient for generating a respective bit/rating coefficient product, and (ii) summing the respective bit/rating coefficient products, wherein the sum represents the digital signal. A frequency converter, is provided for implementing the method, the frequency converter including: a sigma-delta modulator for generating the bit stream, a memory, which stores the weighting coefficients, a multiplier, which is adapted to multiply a respective bit of the bit stream by a corresponding weighting coefficient, and a summer, which is designed to sum the respective bit/rating coefficient products.

The method serves to generate at least one digital or digitized signal based on an analog signal, for example a phase current and/or a phase voltage, generated by a frequency converter on the basis of pulse width modulation. The signal is used to drive an electric motor, wherein the digital signal, in particular in digital representation, corresponds to a mean value of the analog signal over a period of the pulse width modulation. The digital signal is used in particular for the closed-loop control of the analog signal, for example in a servo-converter. According to the method, a continuous bit stream having a predetermined, in particular constant, bit repetition duration is generated based on the analog signal, in particular by a sigma-delta modulator. During a respective time interval which has a duration which is equal to or longer than the period duration of the pulse width modulation, the following steps are performed: multiplying a respective bit of the bit stream by a corresponding rating coefficient to generate a respective bit/rating coefficient product, and summing all of the bit/rating coefficient products over the time interval, wherein the sum over the time interval represents the digital signal. The above-mentioned steps are repeated continuously, for example for each period or every n-th period of the pulse width modulation, where n≥2.

A digital representation of a signal or a digital signal is understood to mean a sequence of time-discretely and amplitude-discretely digitized sampled values, which firstly have a discrete and quantized set of values and, in addition, are defined in terms of the temporal sequence only at specific periodic times or demonstrate a change in the sampled value. The signal with a digital representation is formed from an associated analog signal, which describes the temporally continuous profile of a physical variable, by quantization and sampling, which is performed at different points-in-time. By corresponding encoding, a digital signal can be converted into a binary representation. Moreover, reference is also made to the extensive literature in the art.

In one development, the rating coefficients are generated by superimposing weighting coefficients of a weighting function, wherein a midpoint of a respective weighting function lies within a period of the pulse width modulation, a respective weighting function corresponds to a digital filter function, adjacent weighting functions are shifted in time with respect to one another by one or a multiple of the bit repetition duration, and a respective weighting function has a predetermined number of weighting coefficients. Preferably, the time interval has a duration which is longer than a period of the pulse width modulation by a number of bit repetition durations, wherein the number of bit repetition durations corresponds to the number of weighting coefficients.

In one development, the time interval is arranged centrally with respect to a period of the pulse width modulation.

In one development, the digital filter function is a sinc filter function.

The frequency converter, in particular in the form of a servo-converter, is designed to implement the abovementioned method and comprises: a sigma-delta modulator for generating the bit stream, a memory which stores the weighting coefficients, a multiplier which is designed to multiply a respective bit of the bit stream by a corresponding weighting coefficient, and an adder, which is adapted to sum the respective bit/rating coefficient products.

The invention will be described below with reference to the drawings which illustrate preferred embodiments of the invention schematically as follows.

DETAILED DESCRIPTION OF THE DRAWINGS

Figure 1:
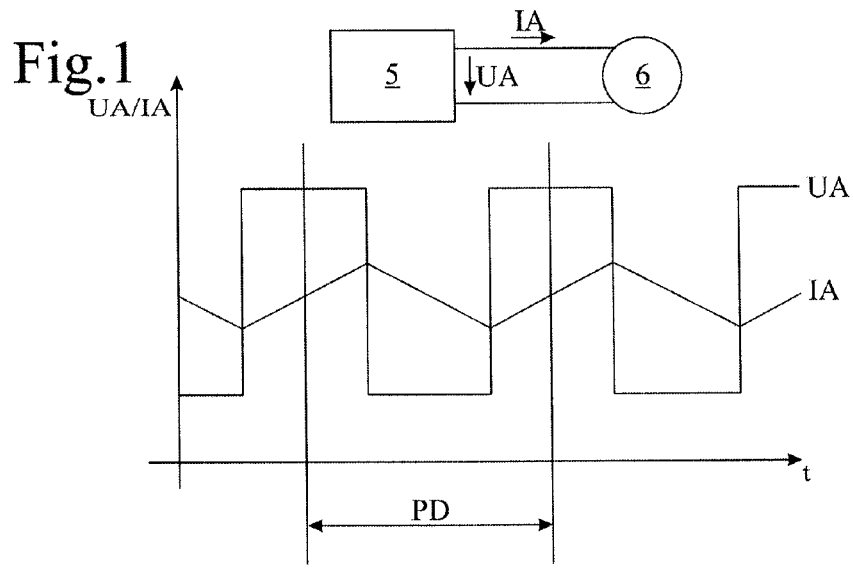
FIG. 1 shows analog signals in the form of a phase voltage and a phase current generated or provided by means of a frequency converter on the basis of a pulse width modulation.

FIG. 1 shows analog signals in the form of a substantially square-wave, pulse-width-modulated phase voltage UA generated or provided conventionally by means of a frequency converter 5 on the basis of pulse width modulation with a variable duty factor and a corresponding, saw-toothed-shaped phase current IA. These are produced in the case of conventional driving, on the basis of pulse width modulation, of an electric motor 6 by the frequency converter 5. For the closed-loop control of the signals UA and/or IA, the signals are digitized continuously in time-discrete and amplitude-discrete fashion in accordance with the invention, wherein the digital or digitized signal corresponds to a mean value of the analog signal UA and IA, respectively, over a period PD of the pulse width modulation. A period can be approximately 0.25 ms, for example, and can be varied depending on requirements.

Figure 2:
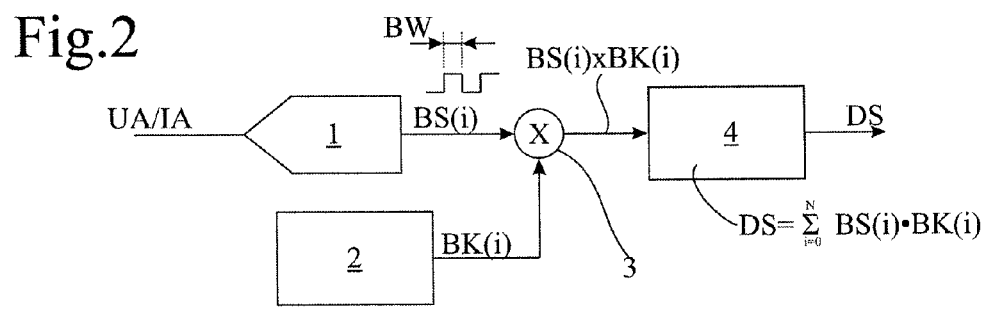
FIG. 2 shows a block circuit diagram of a circuit for generating a digital signal from the signals shown in FIG. 1.

First with reference to FIG. 2, a continuous bit stream $BS(i)$, where $i=0, 1, 2, \ldots$, depending on the analog signal UA or IA and having a predetermined bit repetition duration BW is generated for this purpose by way of a sigma-delta modulator 1. The bit repetition duration BW can be 0.25 µs, for example, which corresponds to a bit repetition rate of 4 MHz.

During a time interval ZI (see FIG. 4), which has a duration which is at least as long as the period PD of the pulse width modulation, all of the bits $BS(i)$ of the bit stream are multiplied, via multiplier 3, by a corresponding rating coefficient $BK(i)$ stored in a memory 2 for generating a respective bit/rating coefficient product. The bit/rating coefficient products thus generated are summed by a summer 4, wherein the sum over the time interval ZI represents the digital signal DS.

The abovementioned steps can be repeated correspondingly for subsequent periods or for every n-th period, wherein the control variable i for this can again be set to zero. If a digitized measured value for each period is intended to be generated, the circuit shown in FIG. 2 can be duplicated, wherein the two circuits operate with a temporal offset, i.e. interleaved.

Figure 3:
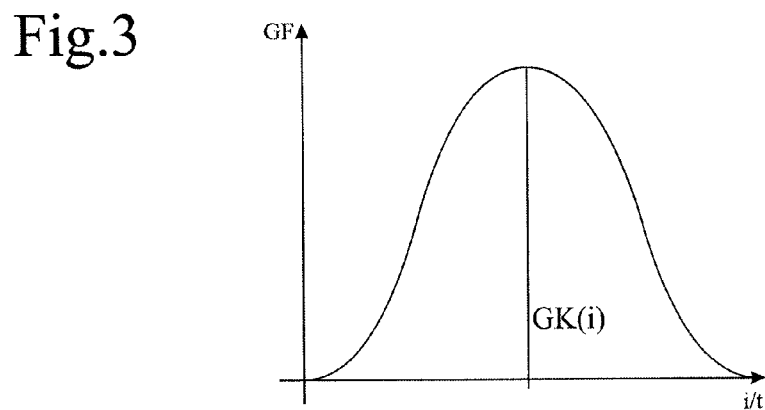
FIG. 3 shows a weighting function of a digital sinc³ filter having in total 384 weighting coefficients.
Figure 4:
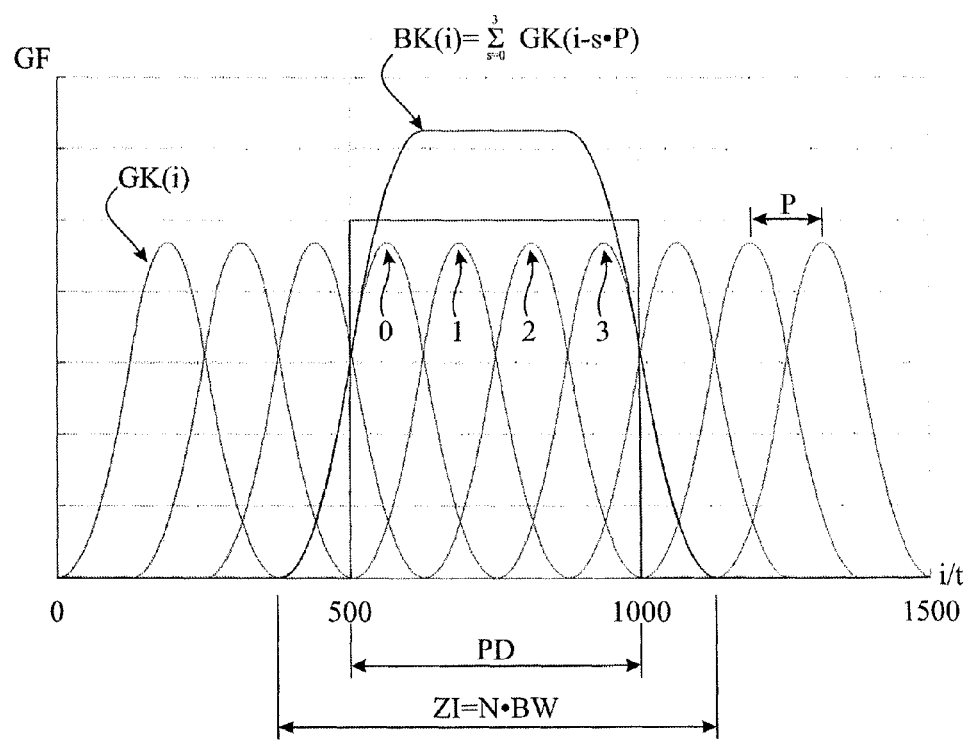
FIG. 4 shows a plurality of adjacent weighting functions, which are shifted in time with respect to one another by a number of bit repetition durations of a sigma-delta modulator, and rating coefficients, which are generated by superimposing weighting coefficients of a specific number of adjacent weighting functions.

The text which follows describes how the rating coefficients $BK(i)$ are calculated with reference to FIGS. 3 and 4. In this case, the bit repetition duration BW in the time range corresponds to a single increment of the control variable i.

FIG. 3 shows a weighting function GF of a conventional digital sinc³ filter with an oversampling ratio of 128 with in total 384 weighting coefficients $GK(i)$. Such filters are conventionally used at the output of sigma-delta modulators for data rate reduction.

FIG. 4 shows, on the basis of the single weighting function GF illustrated in FIG. 3, a plurality of adjacent weighting functions GF, which are shifted with respect to one another by P steps. A single step in this case corresponds to the bit repetition duration BW of the sigma-delta modulator 1, as already mentioned above, with the result that the weighting functions GF are shifted with respect to one another in the time range or over time by P bit repetition durations BW.

The period of the pulse width modulation is 500*BW, by way of example, in FIG. 4 and the time interval ZI, i.e. the integration interval, is (500+384/2+384/2)*BW=N*BW. Consequently, the time interval ZI has a duration which is longer than the period PD of the pulse width modulation by the number of weighting coefficients of the sinc³ filter shown in FIG. 2 multiplied by the bit repetition duration BW.

The time interval ZI is arranged centrally with respect to the period of the pulse width modulation.

The rating coefficients $BK(i)$ are now generated by superimposing the weighting coefficients $GK(i)$ on the weighting function GF, the midpoint of said weighting coefficients being within the period of the pulse width modulation. These are the weighting functions indicated by the numerals 0 to 3.

The rating coefficients $BK(i)$ can be represented as follows:

$$BK(i) = \sum_{s=0}^{s=3} GK(i - s \cdot P)$$

The digital signal DS finally results as:

$$DS = \sum_{i=0}^{N} BS(i) \cdot BK(i)$$

In the method described in DE 10 2007 032 484 A1, the mean value over a plurality of completely digitized sampled values or samples within the period is formed. For this, correspondingly parallelized hardware needs to be provided, which provides these samples with a suitably decimated sampling rate with the required temporal resolution and word width.

Instead of the integral of the decimated samples, in accordance with the invention the integral of the rating or weighting function of associated decimation filters is used, wherein the coefficients required for this are calculated in advance and stored in a memory.

This makes it possible to omit the decimation filter which is required in conventional implementations with sigma-delta modulators, with the result that owing to the saving made in respect of corresponding logic elements, a less expensive and more energy-saving implementation is possible.

It is further possible to use the bit repetition rate of the sigma-delta modulator directly without prior reduction.

The integrated rating function further has the property of being flat in the central region; see FIG. 4. This property can be used, for example, to minimize the memory space requirement for the coefficients since only the rising and the falling edge need to be stored.

Furthermore, this property facilitates matching to a variable period. In the event of a variation in the period duration of the pulse-width-modulated signals, simple adaptation of the method according to the invention is possible, for example, by virtue of the fact that the coefficients $GK(i)$ are matched correspondingly. If, for example, on the basis of the illustration in FIG. 4, the period PD is extended, only the duration of the plateau with constant coefficients $BK(i)$ is extended, and the flanks remain unchanged.

In the embodiments shown, superimposition or integration of the weighting or rating function takes place, which differs from the conventional case of the already decimated samples. The use of the superimposed weighting functions is provided by a memory. Precise matching of the superimposed weighting function to the period of the pulse width modulation is easily possible. Virtually any desired functions can be used as weighting functions, with the result that a large number of associated filter functions can be used.

The precise integration over a period increases the measurement accuracy, as a result of which it is for the first time reasonably possible to perform a phase voltage measurement.

Sinc filters are no longer required, with the result that considerably less hardware resources are used.

The rating coefficients can be used for voltage and current simultaneously.

This results in a large number of application possibilities, such as inverter error compensation, closed-loop voltage control and sensorless closed-loop control up to a speed of zero, for example.

Consequently, the invention enables digitization of converter signals which can be implemented in a simple and inexpensive manner, wherein at the same time interference-free and reliable digitization is ensured.

The invention claimed is:

1. A method for generating a digital signal from an analog signal, the analog signal being generated by a frequency converter on a basis of pulse width modulation, wherein the digital signal corresponds to a mean value of the analog signal over a period of the pulse width modulation, the method comprising the acts of:
   generating a bit stream in response to the analog signal by a sigma-delta modulator, the bit stream having a predetermined bit repetition duration; and
   during a time interval having a duration equal to or larger than the period of the pulse width modulation:
   (i) multiplying a respective bit of the bit stream by a corresponding rating coefficient for generating a respective bit/rating coefficient product, and
   (ii) summing the respective bit/rating coefficient products, wherein the sum represents the digital signal.

2. The method according to claim 1, further comprising the acts of:
   generating the corresponding rating coefficients by superimposing weighting coefficients of weighting functions, wherein:
   a midpoint of a respective weighting function is within the period of the pulse width modulation,
   a respective weighting function corresponds to a digital filter function,
   adjacent weighting functions are temporally shifted with respect to one another by one or a multiple of the bit repetition duration, and
   a respective weighting function has a predetermined number of weighting coefficients.

3. The method according to claim 2, wherein:
   the time interval has a duration which is longer than a period of the pulse width modulation by a number of bit repetition durations, and
   the number of bit repetition durations corresponds to the number of weighting coefficients.

4. The method according to claim 2, wherein the time interval is arranged centrally with respect to the period of the pulse width modulation.

5. The method according to claim 2, wherein the digital filter function is a sinc filter function.

6. The method according to claim 1, wherein:
   the time interval has a duration which is longer than a period of the pulse width modulation by a number of bit repetition durations, and
   the number of bit repetition durations corresponds to the number of weighting coefficients.

7. The method according to claim 6, wherein the time interval is arranged centrally with respect to the period of the pulse width modulation.

8. The method according to claim 6, wherein the digital filter function is a sinc filter function.

9. The method according to claim 1, wherein the time interval is arranged centrally with respect to the period of the pulse width modulation.

10. The method according to claim 9, wherein the digital filter function is a sinc filter function.

11. A frequency converter for generating a digital signal from an analog signal, the analog signal being generated on a basis of pulse width modulation, the frequency converter comprising:
    a sigma-delta modulator that, in response to the analog signal, generates a bit stream having a predetermined bit repetition duration;
    a memory storing weighting coefficients;
    a multiplier configured to multiply, during a time interval having a duration equal to or larger than a period of the pulse width modulation, a respective bit of the bit stream by a corresponding weighting coefficient to generate a respective bit/rating coefficient product; and
    a summer configured to sum the respective bit/rating coefficient products, wherein the sum represents the digital signal which corresponds to a mean value of the analog signal over the period of the pulse width modulation.

12. The frequency converter according to claim 11, wherein
    the rating coefficients are generated by superimposing weighting coefficients of weighting functions, wherein:
    a midpoint of a respective weighting function is within the period of the pulse width modulation,
    a respective weighting function corresponds to a digital filter function,
    adjacent weighting functions are temporally shifted with respect to one another by one or a multiple of the bit repetition duration, and
    a respective weighting function has a predetermined number of weighting coefficients.

13. The frequency converter according to claim 12, wherein the time interval has a duration which is longer than the period of the pulse width modulation by a number of bit repetition durations, and
    the number of bit repetition durations corresponds to the number of weighting coefficients.

14. The frequency converter according to claim 13, wherein the time interval is arranged centrally with respect to the period of pulse width modulation.

15. The frequency converter according to claim 14, wherein the digital filter function is a sinc filter function.

* * * * *